United States Patent
Kang et al.

[11] Patent Number: 5,854,095
[45] Date of Patent: Dec. 29, 1998

[54] DUAL SOURCE GAS METHODS FOR FORMING INTEGRATED CIRCUIT CAPACITOR ELECTRODES

[75] Inventors: Man-sug Kang; Hyun-bo Shin; Seung-joon Ahn; Byung-chul Ahn, all of Kyungki-do, Rep. of Korea

[73] Assignee: Samsung Electronics Co., Ltd., Kyungki-do, Rep. of Korea

[21] Appl. No.: 778,049

[22] Filed: Jan. 2, 1997

[30] Foreign Application Priority Data

Aug. 28, 1996 [KR] Rep. of Korea ............ 1996-36138

[51] Int. Cl.⁶ ............................................. H01L 21/8242
[52] U.S. Cl. ......................................... 438/255; 438/398
[58] Field of Search ............................. 438/238, 255, 438/398

[56] References Cited

U.S. PATENT DOCUMENTS

| | | | |
|---|---|---|---|
| 4,910,043 | 3/1990 | Freeman et al. | 427/39 |
| 5,234,862 | 8/1993 | Aketagawa et al. | 437/103 |
| 5,366,917 | 11/1994 | Watanabe et al. | 437/47 |
| 5,372,962 | 12/1994 | Hirota et al. | 437/47 |
| 5,382,540 | 1/1995 | Sharma et al. | |
| 5,385,863 | 1/1995 | Tatsumi et al. | 437/109 |
| 5,393,373 | 2/1995 | Jun et al. | 438/254 |
| 5,394,012 | 2/1995 | Kimura | 257/739 |
| 5,405,801 | 4/1995 | Han et al. | 437/60 |
| 5,464,791 | 11/1995 | Hirota | 437/60 |
| 5,486,488 | 1/1996 | Kamiyama | 437/60 |
| 5,543,347 | 8/1996 | Kawano et al. | 437/60 |
| 5,554,557 | 9/1996 | Koh | 437/52 |
| 5,567,637 | 10/1996 | Hirota | 437/43 |
| 5,590,051 | 12/1996 | Yokozawa | 364/496 |
| 5,595,937 | 1/1997 | Mikagi | 437/192 |
| 5,597,754 | 1/1997 | Lou et al. | 438/253 |
| 5,616,511 | 4/1997 | Hirota | 438/396 |
| 5,618,747 | 4/1997 | Lou | 438/253 |
| 5,623,243 | 4/1997 | Watanabe et al. | 257/309 |

FOREIGN PATENT DOCUMENTS 4-286151 10/1992 Japan.

OTHER PUBLICATIONS

H. Watanabe et al., *A New Cylindrical Capacitor Using Hemispherical Grained Si (HSG–Si) for 256Mb DRAMs*, 1992 IEEE, IEDM 92, Apr. 1992, 10.1.1–10.1.4. pp. 259–262.

H. Watanabe et al., *A New Cylindrical Capacitor Using Hemispherical Grained Si (HSG–Si) for 256Mb DRAMs*, IETM 92–259, pp. 10.1.1–10.1.4, 1992 IEEE. no month.

Voutsas et al., *Structure of As–Deposited LPCVD Silicon Films at Low Deposition Temperatures and Pressures*, J.Electrochem.Soc., vol. 139, No. 9, Sep. 1992, pp. 2659–2665.

*Primary Examiner*—Jey Tsai
*Attorney, Agent, or Firm*—Myers Bigel Sibley & Sajovec

[57] ABSTRACT

A silicon layer is formed on an integrated circuit substrate using silane and disilane thereby increasing a step coverage for the silicon layer, increasing a deposition rate for the silicon layer, reducing variability of the deposition rate, and reducing local crystallization of the silicon layer. More particularly, the step of forming the silicon layer can include forming a first silicon sublayer on the substrate using a first source gas including silane, and forming a second silicon sublayer on the first silicon sublayer using a second source gas different from the first source gas wherein the second source gas includes disilane. Alternately, the step of forming the silicon layer can include forming the silicon layer on the integrated circuit substrate using a source gas including a mixture of silane and disilane.

28 Claims, 7 Drawing Sheets

DUAL SOURCE GAS METHODS FOR FORMING INTEGRATED CIRCUIT CAPACITOR ELECTRODES

FIELD OF THE INVENTION

The present invention relates to the field of microelectronics, and more particularly to methods for forming conductive layers for microelectronic devices.

BACKGROUND OF THE INVENTION

A dynamic random access memory (DRAM) includes an array of memory cells wherein each memory cell includes a memory cell capacitor and a memory cell access transistor. Each memory cell capacitor stores one bit of information for the memory device, and this bit of information can be written to or read from the memory cell by turning the memory cell access transistor on. Accordingly, the memory cell access transistor should be able to store a predetermined electrical charge at the operating voltage for the memory device. This predetermined charge should be greater than a minimum value so that data values of 1 and 0 can be distinguished.

The electrical charge Q of a memory cell capacitor is determined by multiplying its capacitance C by the operating voltage V for the memory device (Q=C*V). The capacitance C, in turn, is directly proportional to the surface area of the capacitor electrodes and the dielectric constant for the dielectric layer, and inversely proportional to the thickness of the dielectric layer. As the integration densities of memory devices have increased, however, the space available for each memory cell capacitor has decreased, and the operating voltages for the memory devices have decreased. To maintain the desired charge storing capability for a memory cell capacitor, however, the capacitance C for the memory cell capacitors must still be increased.

The capacitance can be increased by increasing the effective area of the capacitor, increasing the dielectric constant for the dielectric layer, and reducing the thickness of the dielectric layer. As discussed above, the area available for a memory cell capacitor is typically reduced when integration densities increase. Accordingly, there exists a need in the art to provide capacitor electrodes having an increased surface area on a smaller portion of a substrate. In response, three dimensional electrode structures have been developed to increase electrode surface areas. In addition, hemispherical grain silicon has been used to increase electrode surface areas. For example, the use of hemispherical grained Si in a capacitor is discussed in the reference by Watanabe et al. entitled *A New Cylindrical Capacitor Using Hemispherical Grained Si (HSG-Si) For 256Mb DRAMs*, IETM 92–259, pp. 10.1.1–10.1.4, 1992 IEEE.

In particular, amorphous silicon can be phased-transformed to polysilicon to thereby form HSG polysilicon. Amorphous silicon can be deposited on a substrate and then heated to form small hemispherical grains. These small hemispherical grains can then be phased-transformed into an intermediate polysilicon having an irregular surface. The irregular surface thus formed by the phase-transformation may have a surface area two to three times that of a flat surface.

A method for forming a storage electrode using hemispherical grained (HSG) polysilicon will now be discussed with reference to FIGS. 1 through 4. As shown in FIG. 1, a field oxide layer 12 is formed on a semiconductor substrate 10 defining active and field regions of the substrate. A gate insulating layer 14 and a gate electrode 16 are then formed on an active region, and portions of the active region are doped to provide the source/drain region 17. A first insulating layer 18 is then formed on the substrate, the gate electrodes, and the field region, and a contact hole 19 is formed therein thus exposing one of the source/drain regions 17. A conductive layer is formed on the insulating layer 18 filling the contact hole 19, and this conductive layer is patterned to form a bit line 20. A second insulating layer 22 is then formed on the first insulating layer 18 and the bit line 20, and contact holes 23 are formed therein exposing additional source/drain regions 17 as shown.

Silicon layer 24 is formed on the second insulating layer 22, and this silicon layer fills the contact holes 23 providing electrical contacts with the source/drain regions 17, as shown in FIG. 2. This silicon layer 24 can be formed using a source gas including silane. The silicon layer 24 is then patterned to provide the storage electrodes 24A, as shown in FIG. 3. This structure is then heat treated to form HSG polysilicon 26 on exposed portions of the storage electrode 24A as shown in FIG. 4.

When using silane as a source gas to form the silicon layer 24, however, the deposition rate may be relatively low, and the silane may compete with the doping gas for deposition places. In addition, the deposition rate may vary greatly as a function of the ratio of the doping gas to the source gas, and the thickness of the resulting layer may thus be difficult to control. Moreover, a relatively high process temperature may be required.

In addition, a portion of the storage electrode 24A may be partially crystallized during the heat treatment used to form the HSG polysilicon. The amorphous silicon may thus move to a nuclei of the partially crystallized silicon thereby reducing uniformity of crystallization when growing the HSG polysilicon grains on the surface of the storage electrode 24A. Accordingly, bald defects may occur wherein HSG polysilicon 26 does not form on areas of the storage electrode, as shown in region A of FIGS. 4 and 5.

When using disilane as the source gas for forming the silicon layer 24 on a structure having relatively large steps, the step coverage of the silicon layer may be relatively low. In particular, when using disilane as a source gas to fill a contact hole for a storage electrode of a capacitor on bit line (COB) structure, the resulting silicon film may have a step coverage of 60 percent or less. Accordingly, the generation of voids in the silicon material filling the contact hole may reduce the reliability of the memory device, as shown in region B of FIG. 6. Accordingly, there continues to exist a need in the art for improved methods of forming capacitor electrode structures.

SUMMARY OF THE INVENTION

It is therefore an object of the present invention to provide improved methods for forming silicon layers, silicon electrodes, and capacitors.

It is another object of the present invention to provide methods for forming capacitors having increased capacitance.

It is another object of the present invention to provide silicon electrodes having uniform HSG polysilicon layers thereon.

It is still another object of the present invention to provide methods for forming silicon layers having increased step coverage, increased deposition rates, and increased uniformity of deposition rate.

These and other objects are provided according to the present invention by methods including the step of forming a silicon layer on an integrated circuit substrate using silane and disilane. The use of silane provides increased step coverage for the silicon layer allowing the silicon layer to fill contact holes with reductions in voids formed therein. The use of disilane increases a deposition rate for the formation of the silicon layer and reduces variability of the deposition rate for the silicon film. In addition, the use of disilane can reduce local crystallization of the silicon layer thus increasing the uniformity of an HSG polysilicon layer formed thereon. Silicon layers formed according to the present invention can thus be used to provide improved capacitor electrodes, and more particularly to provide improved capacitor storage electrodes for dynamic random access memory devices.

In particular, the step of forming the silicon layer can include the steps of forming a first silicon sublayer on the substrate using a first source gas comprising silane, and forming a second silicon sublayer on the first silicon sublayer using a second source gas different form the first source gas wherein the second source gas comprises disilane. Accordingly, the first silicon sublayer provides increased step coverage thus allowing the silicon layer to fill contact holes in the substrate while reducing voids therein. The second silicon sublayer can be grown at an increased deposition rate thus reducing process time, and the second silicon sublayer can be formed at a deposition rate having reduced variability thus increasing control over the thickness of the silicon layer. As discussed above, the disilane can also reduce local crystallization of the silicon layer.

Alternately, the step of forming the silicon layer can include forming the silicon layer on the integrated circuit substrate using a source gas including a mixture of silane and disilane. Again, the use of silane can improve the step coverage for the silicon layer and the use of disilane can improve the deposition rate and reduce local crystallization.

Methods according to the present invention can thus be used to provide improved integrated circuit memory devices such as dynamic random access memories. In particular, a memory cell access transistor can be formed on an integrated circuit substrate wherein the memory cell access transistor includes doped source/drain regions of the substrate. An insulating layer can be formed on the integrated circuit substrate and on the memory cell access transistor wherein the insulating layer has a contact hole therein exposing a portion of one of the doped source/drain regions of the substrate. A silicon layer can then be formed on the integrated circuit substrate using silane and disilane according to the present invention. This silicon layer can then be patterned to provide a storage electrode including the patterned silicon layer connected to the exposed source/drain region through the contact hole. A dielectric layer can then be formed on the exposed portions of the storage electrode, and a conductive layer can then be formed on the dielectric layer opposite the storage electrode.

A silicon layer formed according to the present invention can be used to form a storage electrode for a memory cell capacitor. By reducing voids in the contact hole, a reliable connection can be formed between the storage electrode and the memory cell access transistor. In addition, the storage electrode can be formed with reduced local crystallization thus facilitating the formation of an HSG polysilicon layer thereon. Accordingly, an HSG polysilicon layer can be formed on the storage electrode thus increasing a surface area thereof. Accordingly, the capacitance of the memory cell capacitor can be increased.

According to the methods of the present invention, the step coverage of silicon layers can be increased reducing the generation of voids in portions of the silicon layers formed in contact holes. In addition, local crystallization of the silicon films formed by methods of the present invention can be reduced thus reducing bald defects in HSG polysilicon layers formed thereon. In addition, silicon layers can be formed at an increased deposition rate, and variability of the deposition rate can be decreased. Furthermore, silicon layers formed according to the present invention can be used to provide storage electrodes having increased surface areas thereby increasing the capacitance of capacitors including the storage electrodes.

DETAILED DESCRIPTION

Figure 1:
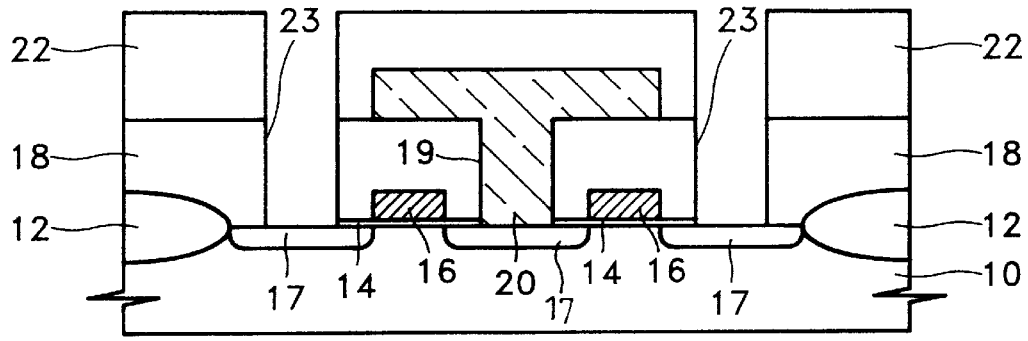
FIGS. 1 through 4 are cross sectional views illustrating steps of a method for forming a storage electrode according to the prior art.
Figure 2:
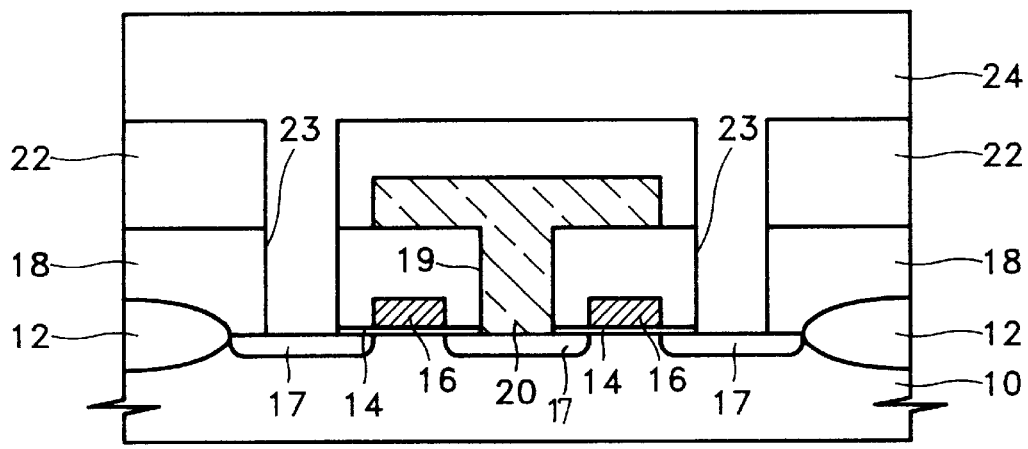
Figure 3:
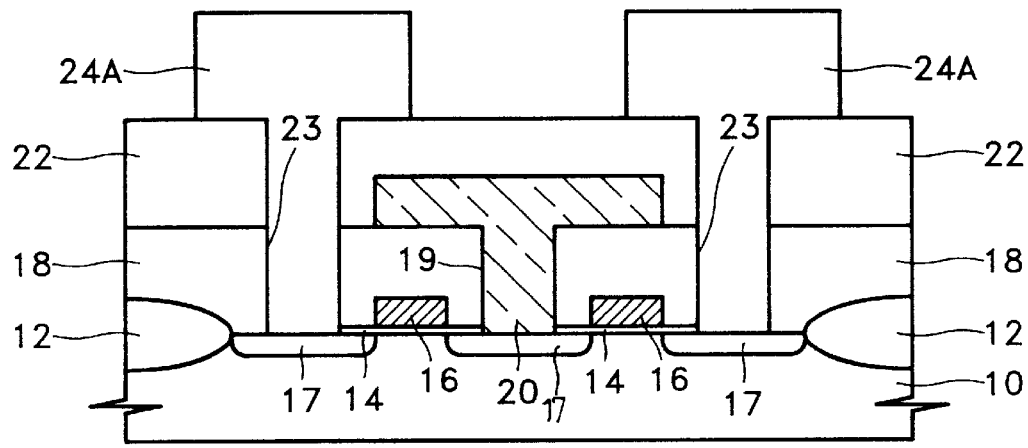
Figure 4:
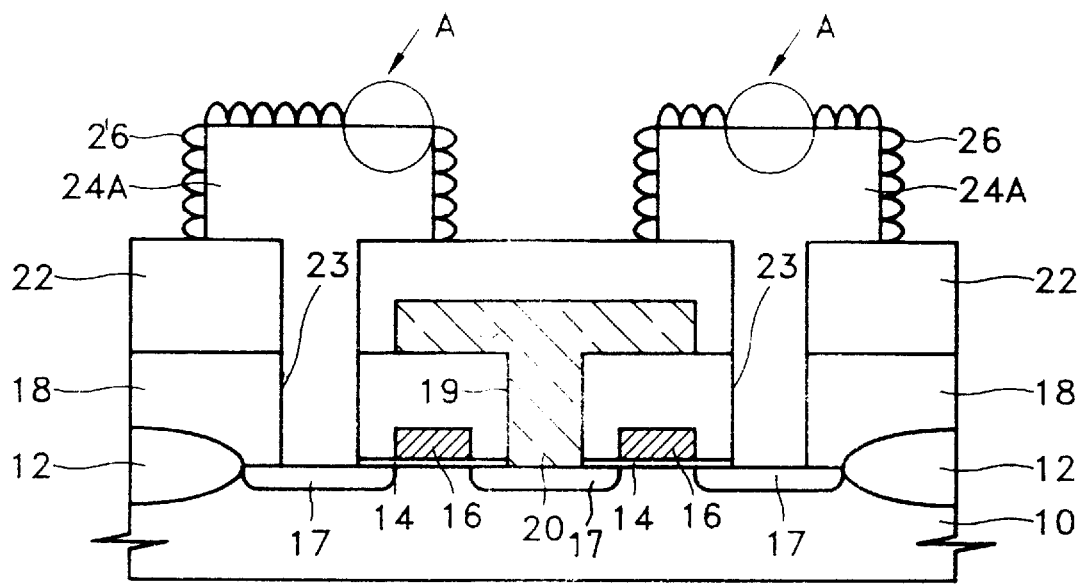
Figure 5:
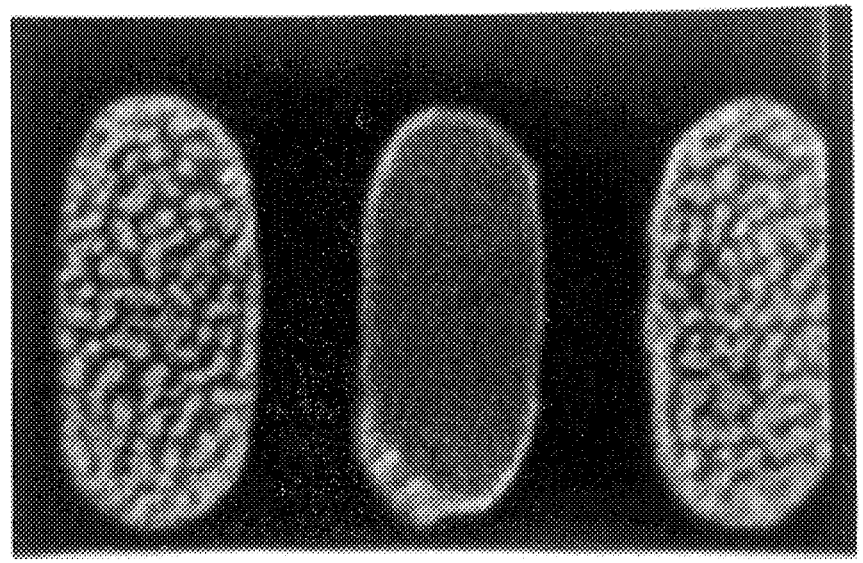
FIG. 5 is a scanning electron microscope photograph of a top side of a storage electrode formed using silane as a source gas according to the prior art.
Figure 6:
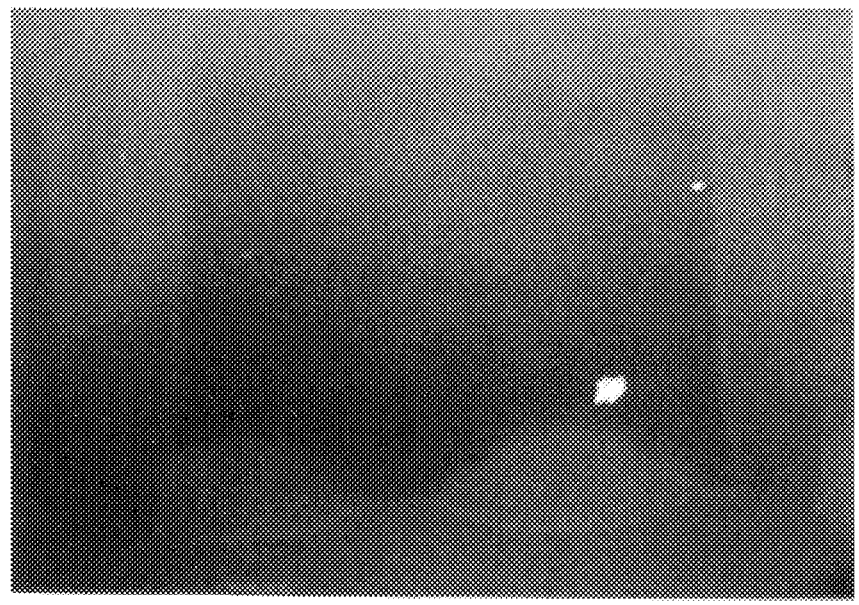
FIG. 6 is a scanning electron microscope photograph of a cross section of a storage electrode formed using disilane as a source gas according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 7:
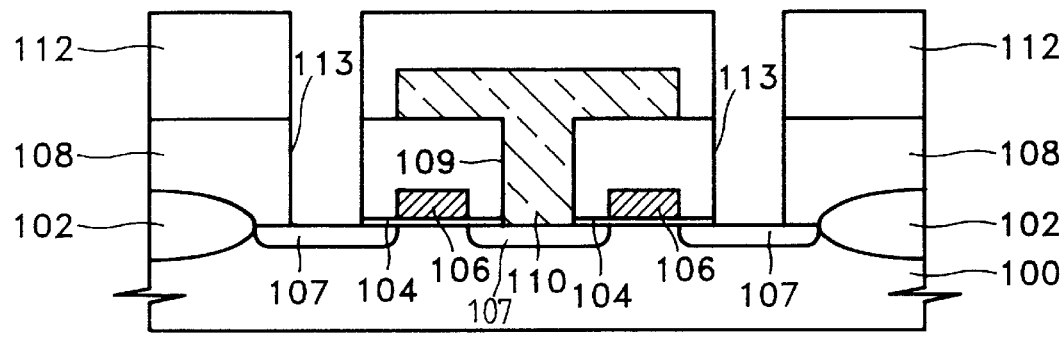
FIGS. 7 through 9 are cross sectional views illustrating steps of a method for forming a storage electrode according to the present invention.
Figure 8:
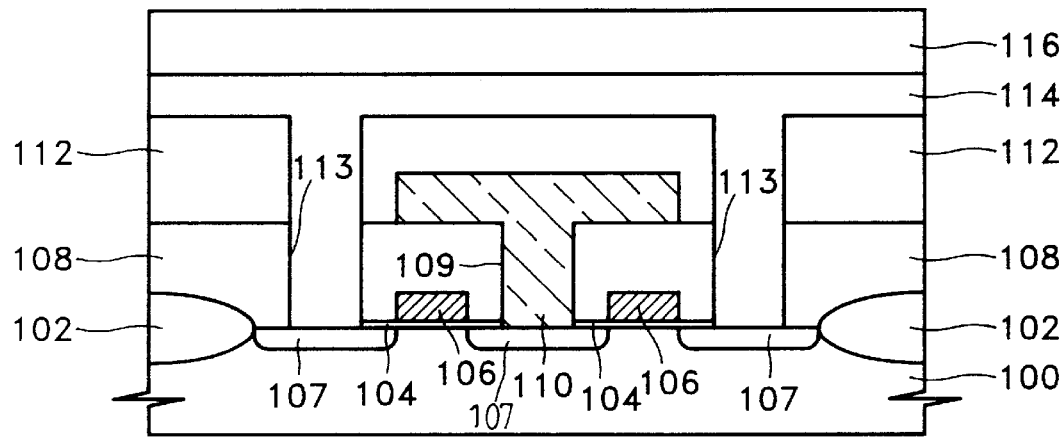
Figure 9:
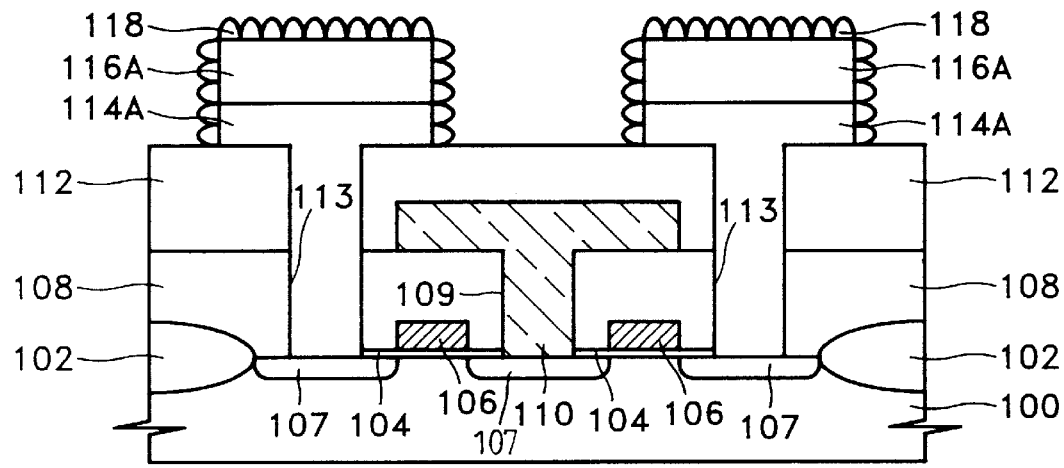

As shown in FIG. 7, a field oxide layer 102 is formed on a semiconductor substrate 100 defining active and field regions of the substrate. A gate insulating layer 104 and a gate electrode 106 are formed on the active region, and portions of the active region are doped thus forming spaced apart source/drain regions 107. A first insulating layer 108 is formed on the surface of the substrate covering the gate electrodes 106 and the source/drain regions 107. A contact hole 109 is formed in the first insulating layer 108 exposing a source/drain region 107. A conductive film is formed on the insulating layer 108 filling the contact hole 109 making contact with the source/drain region 107, as shown in FIG. 8.

The conductive layer is patterned to form the bit line 110. A second insulating layer 112 is then formed on a first insulating layer 108 and the bit line 110. The contact holes 113 are then formed through the first and second insulating layers 108 and 112 thus exposing portions of the source/drain regions 107, as shown in FIG. 7. The contact holes 113 can then be used to provide electrical connection between respective source/drain regions 107 and capacitor storage electrodes.

A first silicon layer 114 is formed on the second insulating layer 112 filling the contact holes 113. In particular, the first silicon layer can be formed using silane as a source gas. A second silicon layer 116 is then formed on the first silicon layer 114 using disilane as a source gas. More particularly, the first and second silicon layers 114 and 116 are formed in-situ using a chemical vapor deposition (CVD) technique. The first silicon layer 114 is preferably formed at a temperature in the range of 490° C. to 560° C., and the second silicon layer 116 is preferably formed at a temperature in the range of 480° C. to 560° C.

Furthermore, the first silicon layer 114 preferably has a thickness in the range of 500 angstroms to 3,000 angstroms, and a second silicon layer preferably has a thickness in the range of 1,000 angstroms to 10,000 angstroms. These silicon layers can be doped in-situ using a doping gas during deposition so that the first and second silicon layers are doped and thus conductive. The in-situ doping gas can include $PH_3$, $AsH_3$, and/or boron. Moreover, these doping gases can be diluted.

The first and second silicon layers 114 and 116 can be patterned using photolithographic techniques to form the storage electrodes including the first and second patterned silicon layers 114A and 116A. The HSG polysilicon layer 118 is then formed on exposed portions of the storage electrode. The HSG polysilicon layer 118 can be formed by heat treating the storage electrode at an extremely low pressure on the order of less than $1 \times 10^{-7}$ Torr. When using a heat treatment to form the HSG polysilicon layer, it is preferable that any oxide on the storage electrode be removed.

Alternately, the HSG polysilicon layer can be formed using chemical vapor deposition on the storage electrodes at a temperature wherein amorphous silicon is phased-transformed into polysilicon thus forming HSG polysilicon nuclei on the storage electrode. More particularly, this chemical vapor deposition can be performed using silane or disilane, and a heat-treating step follows the chemical vapor deposition to form the hemispherical grained polysilicon.

According to the present invention, the contact holes 113 are filled with a silicon layer formed using a source gas including silane. The use of silane reduces voids and the contact holes 113 during the formation of the first silicon layer 114. The second silicon layer 116 is then formed on the first silicon layer 114 using a source gas including disilane. The use of a source gas including disilane can increase the deposition rate of forming the second silicon layer 116, and variability of the deposition rate as a function of the doping gas can be reduced.

Furthermore, the use of disilane may reduce local crystallization during formation of the HSG layer 118. Because of the occurrence of voids in the contact holes 113 is reduced, the reliability of the memory device can be increased. In addition, bald defects wherein the HSG polysilicon layer 118 does not uniformly cover the storage electrode can be reduced because local crystallization is reduced.

Figure 10:
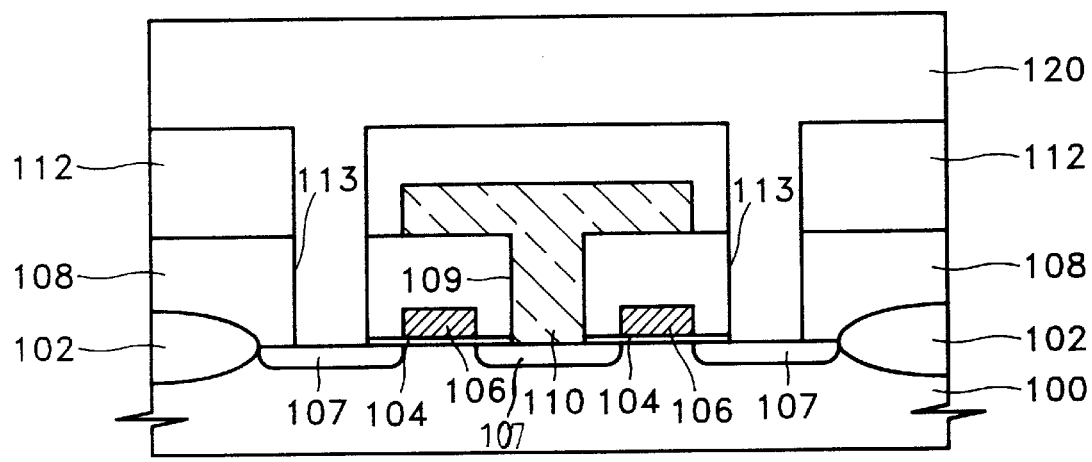
FIGS. 10 through 11 are cross sectional views illustrating steps of an alternate method for forming a storage electrode according to the present invention.
Figure 11:
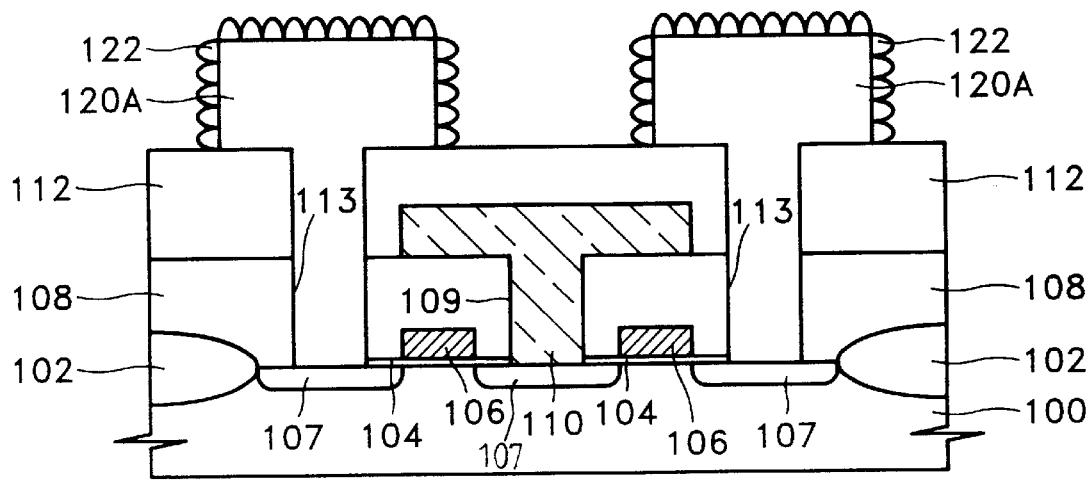

Alternate steps for forming capacitor electrodes according to the present invention are illustrated in FIGS. 10 and 11. The field layers 102, the source/drain regions 107, the gate insulating layers 104, the gate electrodes 106, the first and second insulating layers 108 and 112, the bit line 110, and the contact holes 113 are formed, as discussed above with regard to FIG. 7. A silicon layer 120 is then formed on the second insulating layer 112 filling the contact holes 113 as shown in FIG. 10.

In particular, this silicon layer can be formed using a source gas including a mixture of silane and disilane wherein a ratio of the silane to disilane is in the range of 2:1 to 100:1, and the silane gas can flow at a rate of 100 sccm to 1,000 sccm, and the disilane gas can flow at a rate of 1 sccm to 100 sccm. The silicon layer 120 on the second insulating layer 112 preferably has a thickness in the range of 3,000 angstroms to 15,000 angstroms, and this silicon layer is preferably formed at a temperature in the range of 480° C. to 560° C. Moreover, the silicon layer 120 can be doped in-situ using a doping gas when forming the silicon layer. The doping gas preferably includes one of $PH_3$, $AsH_3$, and/or boron. Each of these doping gases can be diluted.

The silicon layer 120 is then patterned to form the storage electrode 120A as shown in FIG. 11. The HSG polysilicon layer 122 is then formed on exposed portions of the storage electrode 120A. As before, the HSG polysilicon layer 122 can be formed by heat treating the storage electrode at an extremely low pressure. As before, oxides are preferably removed from the storage electrode prior to the heat treatment.

Alternately, the HSG polysilicon layer 122 can be formed using chemical vapor deposition with a source gas including silane or disilane at a temperature wherein amorphous silicon is phased-transformed into polysilicon, thus forming HSG polysilicon nuclei which can then be heat treated to form the HSG polysilicon layer.

The flow rates of silane and disilane are preferably controlled during the deposition of the silicon layer 120 to enhance the step coverage of the silicon layer 120 and to increase uniformity of the HSG polysilicon layer 122 formed on the surface of the storage electrode 120A. In particular, the use of a source gas including silane during deposition of the silicon layer 120 can result in step coverage that is 90% or higher. In contrast, when disilane alone is used as the source gas, the step coverage may be as low as 60%. By increasing the step coverage for the silicon layer 120, voids in silicon filling the contact holes 113 can be reduced thus increasing reliability for the memory device. Use of a source gas including disilane when forming the silicon layer 120 can be used to increase the growth rate of the silicon layer, decrease variability of the growth rate, and increase the uniformity of the HSG layer formed thereon.

Accordingly, the flow of silane should be increased when forming portions of the silicon layer 120 filling the contact holes 113. The flow rate of disilane should be increased when forming portions of the silicon layer 120 on the second insulating layer 112. The formation of voids in the contact holes 113 can thus be reduced, and the uniformity of the HSG polysilicon layer formed on the storage electrodes can also be increased. The uniform HSG polysilicon layer can thus be used to provide an increased surface area for the electrode increasing the capacitance of capacitor using the electrode.

As a first example, storage electrode is formed according to the present invention as discussed below. In particular, a silicon layer is formed on an insulating layer having contact holes therein as discussed above with regard to FIG. 7. In particular, the silicon layer is formed by injecting silane into a reaction chamber at a temperature of approximately 510° C. at a pressure of approximately 0.8 Torr. The silicon layer thus formed fills the contact hole and has a thickness of approximately 2,000 angstroms on the insulating layer. The silicon layer is doped in-situ so that the silicon layer has dopants therein.

A second silicon layer is then formed on the first silicon layer by injecting disilane gas into the reaction chamber at a temperature of approximately 510° C. and a pressure of approximately 0.5 Torr. The second silicon layer can have a thickness of approximately 6,000 angstroms on the first silicon layer. The second silicon layer is preferably doped in-situ by injecting a doping gas simultaneously with the source gas thus providing dopants of the second silicon layer.

Figure 12:
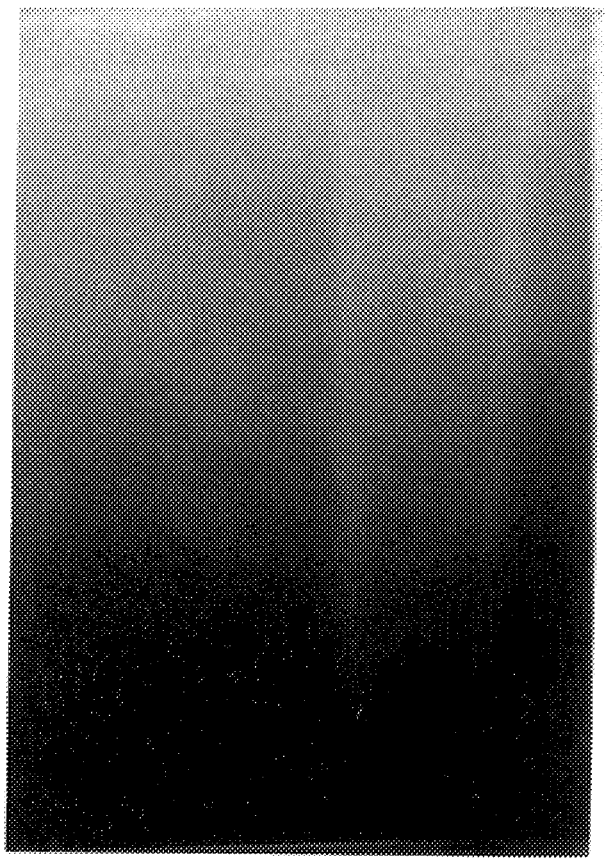
FIG. 12 is a scanning electron microscope photograph of a cross section of a storage electrode formed using steps illustrated in FIGS. 7 through 9.
Figure 13:
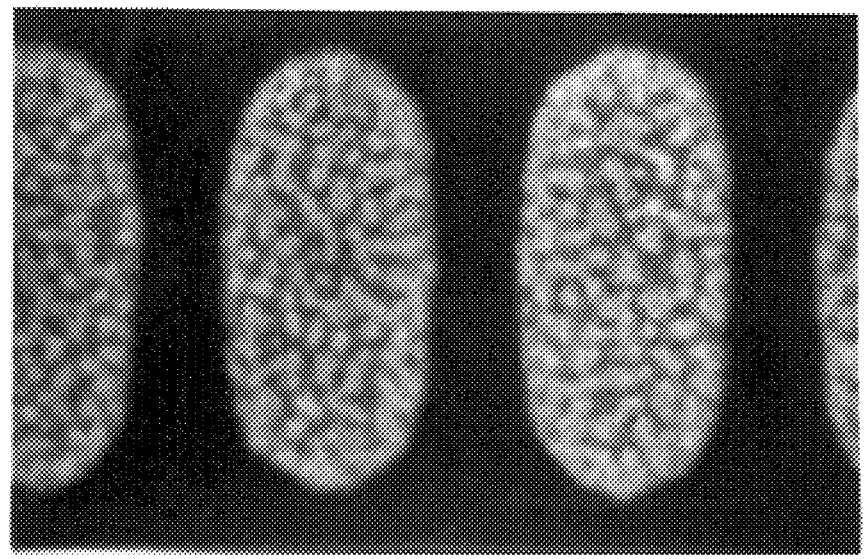
FIG. 13 is a scanning electron microscope photograph of a top of a storage electrode formed using steps illustrated in FIGS. 7 through 9.

The first and second silicon layers are then patterned to form storage electrodes. The substrate including the storage electrodes is placed in a CVD reaction chamber and heated to 750° C. at a pressure of $10^{-7}$ Torr. Disilane gas is injected into the reaction chamber at a rate of 18 sccm to form HSG polysilicon nuclei. The reaction conditions in the chamber are then changed to 760° C. and $10^{-7}$ Torr to heat treat the nuclei thus forming a HSG polysilicon layer on the storage electrodes. As shown in FIG. 12, significant voids are not formed in the contact hole. As shown in FIG. 13, the HSG polysilicon layer is formed uniformly on the surface of the storage electrodes.

Figure 14:
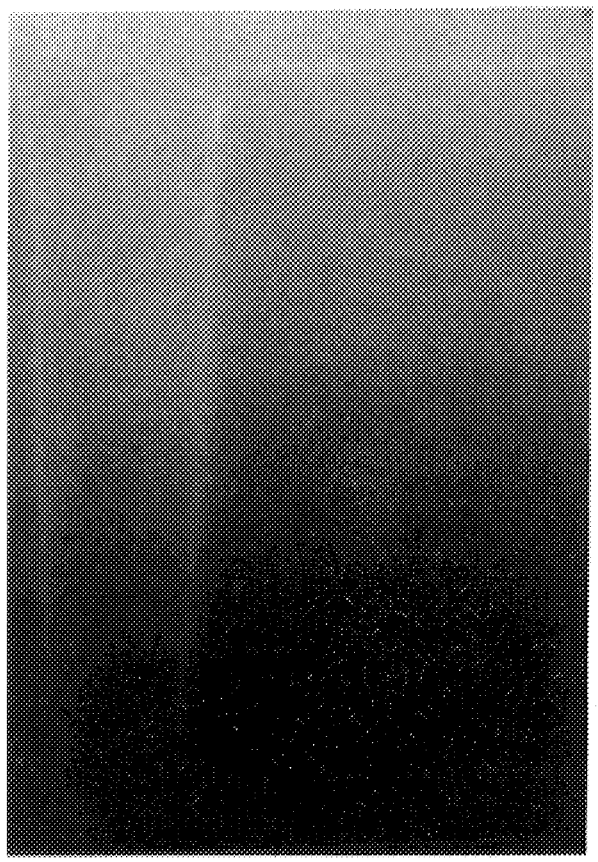
FIG. 14 is a scanning electron microscope photograph of a cross section of a storage electrode formed using steps illustrated in FIGS. 10 and 11.
Figure 15:
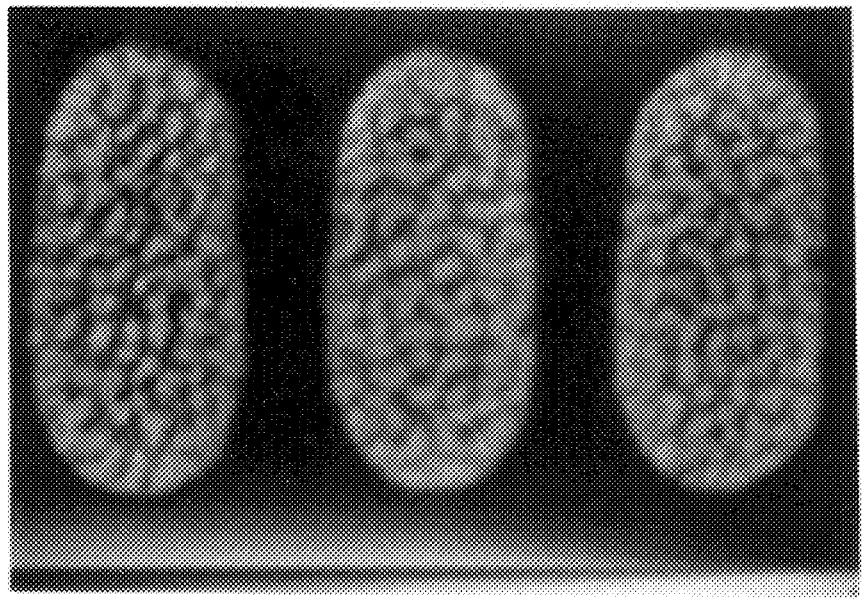
FIG. 15 is a scanning electron microscope photograph of a top of a storage electrode formed using steps illustrated in FIGS. 10 and 11.

A second example of a method according to the present invention will be discussed below. Again, a silicon layer is formed on an insulating layer having a contact hole therein. This silicon layer is formed by injecting silane gas at 400 sccm and disilane gas at 70 sccm at a temperature of approximately 510° C. and at a pressure of approximately 0.5 Torr. Accordingly, the mixture of silane and disilane gases has a ratio of approximately 40:7. This silicon layer fills the contact hole and provides a thickness of approximately 8,000 angstroms on the insulating layer. This silicon layer is then patterned, and HSG polysilicon is formed on the resulting storage electrode as discussed above. As shown in FIG. 14, voids are not generated in the contact hole, and as shown in FIG. 15, HSG polysilicon is formed uniformly on the storage electrode.

According to the methods discussed above, silicon layers can be formed using both silane and disilane. In particular, the use of silane can reduce the generation of voids in portions of the silicon layer filling contact holes, and the use of disilane can increase the deposition rate of the silicon layer and reduce variability of the deposition rate as a function of dopants introduced thereto. In addition, the use of disilane can reduce local crystallization during the formation of the silicon layer thus increasing uniformity of an HSG polysilicon layer formed thereon. As discussed above, silicon layers can be formed according to the invention using silane and disilane sequentially or as a mixed gas.

The generation of voids in portions of a silicon layer formed in contact holes can thus be reduced thereby increasing reliability of an electrical connection between memory cell access transistors and memory cell capacitors. More generally, the use of silane increases the step coverage for silicon layers formed on substrates having large step differences. The use of disilane reduces the generation of local crystallization, and increases the deposition rate. The reduction of local crystallization thereby reduces bald defects wherein the HSG polysilicon layer is not formed uniformly on the silicon layer. Accordingly, the silicon layers discussed above can be used to provide capacitor electrodes having increased surface areas thereby increasing the capacitance of capacitors including these electrodes. Moreover, the reliability of a connection of these storage electrodes to the substrate through contact holes can be increased.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for forming an integrated circuit memory device, said method comprising the steps of:

forming a memory cell access transistor on an integrated circuit substrate wherein said memory cell access transistor comprises doped source/drain regions of said substrate;

forming an insulating layer on said integrated circuit substrate and on said memory cell access transistor wherein said insulating layer has a contact hole therein exposing a portion of one of said doped source/drain regions of said substrate;

forming a first amorphous silicon layer on said insulating layer opposite said substrate using a first source gas comprising silane wherein said first amorphous silicon layer fills said contact hole and contacts said exposed source/drain region;

forming a second amorphous silicon layer on said first amorphous silicon layer using a second source gas different from said first source gas wherein said second source gas comprises disilane; and patterning said first and second amorphous silicon layers to provide a storage electrode comprising said first and second patterned amorphous silicon layers connected to said exposed source/drain region through said contact hole;

forming a dielectric layer on said exposed portions of said storage electrode; and forming a conductive layer on said dielectric layer opposite said storage electrode;

wherein said step of forming said dielectric layer is preceded by the step of:

forming hemispherical grain polysilicon on exposed portions of said storage electrode made up of said first and second patterned amorphous silicon layers.

2. A method according to claim 1 wherein said step of forming said first silicon layer is performed at a temperature in the range of 490° C. to 560° C.

3. A method according to claim 1 wherein said step of forming said second silicon layer is performed at a temperature in the range of 480° C. to 560° C.

4. A method according to claim 1 wherein a thickness of said first silicon layer is in the range of 500 Angstroms to 3000 Angstroms, and wherein a thickness of said second silicon layer is in the range of 1000 Angstroms to 10,000 Angstroms.

5. A method according to claim 1 wherein said steps of forming said first and second silicon layers comprise doping said respective first and second silicon layers in-situ using a respective doping gas.

6. A method according to claim 5 wherein said doping gas comprises a gas selected from the group consisting of $PH_3$, $AsH_3$, and boron.

7. A method according to claim 1 wherein said step of forming hemispherical grain polysilicon comprises annealing said storage electrode at a pressure on the order of less than $1\times10^{-7}$ Torr.

8. A method according to claim 1 wherein said step of forming hemispherical grain polysilicon comprises:

performing a chemical vapor deposition using a gas selected from the group consisting of silane and disilane at a predetermined temperature wherein amorphous silicon phase transforms to polysilicon.

9. A method according to claim 1 wherein said step of forming hemispherical grain polysilicon comprises forming hemispherical grain polysilicon nuclei on said storage electrode and annealing said storage electrode and said hemispherical grain polysilicon nuclei.

10. A method according to claim 9 wherein said hemispherical grain polysilicon nuclei are formed by chemical vapor deposition using a source gas comprising a gas selected from the group consisting of silane and disilane.

11. A method according to claim 1 further comprising the step of forming a bit line connected to a second one of said source/drain regions.

12. A method for forming an integrated circuit memory device, said method comprising the steps of:

forming a memory cell access transistor on an integrated circuit substrate wherein said memory cell access transistor comprises doped source/drain regions of said substrate;

forming an insulating layer on said integrated circuit substrate and on said memory cell access transistor wherein said insulating layer has a contact hole therein exposing a portion of one of said doped source/drain regions of said substrate;

forming an amorphous silicon layer on said integrated circuit substrate using a source gas including a mixture of silane and disilane wherein said silicon layer fills said contact hole;

patterning said amorphous silicon layer to provide a storage electrode comprising said patterned amorphous silicon layer connected to said exposed source/drain region through said contact hole;

forming a dielectric layer on said exposed portions of said storage electrode; and forming a conductive layer on said dielectric layer opposite said storage electrode;

wherein said step of forming said dielectric layer is preceded by the step of forming hemispherical grain polysilicon on exposed portions of said storage electrode.

13. A method according to claim 12 wherein said step of forming said amorphous silicon layer is performed at a temperature in the range of 480° C. to 560° C.

14. A method according to claim 12 wherein said mixture has a ratio of silane to disilane in the range of 2:1 to 100:1.

15. A method according to claim 12 wherein a thickness of said silicon layer is in the range of 3000 Angstroms to 15,000 Angstroms.

16. A method according to claim 12 wherein said steps of forming said silicon layer comprise doping said silicon layer in-situ using a respective doping gas.

17. A method according to claim 16 wherein said doping gas comprises a gas selected from the group consisting of $PH_3$, $AsH_3$, and boron.

18. A method according to claim 12 wherein said step of forming hemispherical grain polysilicon comprises annealing said storage electrode at a pressure on the order of less than $1\times10^{-7}$ Torr.

19. A method according to claim 12 wherein said step of forming hemispherical grain polysilicon comprises:

performing a chemical vapor deposition using a gas selected from the group consisting of silane and disilane at a predetermined temperature wherein amorphous silicon phase transforms to polysilicon.

20. A method according to claim 12 wherein said step of forming hemispherical grain polysilicon comprises forming hemispherical grain polysilicon nuclei on said storage electrode and annealing said storage electrode and said hemispherical grain polysilicon nuclei.

21. A method according to claim 20 wherein said hemispherical grain polysilicon nuclei are formed by chemical vapor deposition using a source gas comprising a gas selected from the group consisting of silane and disilane.

22. A method according to claim 21 further comprising the step of forming a bit line connected to a second one of said source/drain regions.

23. A method according to claim 1 wherein said step of forming said first amorphous silicon layer is performed at a temperature in the range of 490° C. to 510° C.

24. A method according to claim 11 wherein said step of forming said second amorphous silicon layer is performed at a temperature in the range of 480° C. to 510° C.

25. A method according to claim 1 wherein said step of forming said first amorphous silicon layer is performed using low pressure chemical vapor deposition.

26. A method according to claim 1 wherein said step of forming said second amorphous silicon layer is performed using low pressure chemical vapor deposition.

27. A method according to claim 12 wherein said step of forming said amorphous silicon layer is performed using low pressure chemical vapor deposition.

28. A method according to claim 12 wherein said step of forming said amorphous silicon layer is performed at a temperature in the range of 480° C. to 510° C.

* * * * *

UNITED STATES PATENT AND TRADEMARK OFFICE
CERTIFICATE OF CORRECTION

PATENT NO. : 5,854,095
DATED : December 29, 1998
INVENTOR(S) : Kang et al.

It is certified that error appears in the above-identified patent and that said Letters Patent is hereby corrected as shown below:

Claim 24, line 1, "11" should read --1--.

Signed and Sealed this

Tenth Day of August, 1999

Attest:

Q. TODD DICKINSON

*Attesting Officer*    Acting Commissioner of Patents and Trademarks